US007461324B2

(12) United States Patent
Berkmann et al.

(10) Patent No.: US 7,461,324 B2
(45) Date of Patent: Dec. 2, 2008

(54) PARALLEL PROCESSING FOR DECODING AND CYCLIC REDUNDANCY CHECKING FOR THE RECEPTION OF MOBILE RADIO SIGNALS

(75) Inventors: Jens Berkmann, Munich (DE); Wolfgang Haas, Perchtoldsdorf (AT); Thomas Herndl, Biedermannsdorf (AT); Gerald Hodits, Vienna (AT); Armin Häutle, Dachau (DE); Sasha Simeunovic, Vienna (AT)

(73) Assignee: Infineon Technologies, Munich (DE)

( * ) Notice: Subject to any disclaimer, the term of this patent is extended or adjusted under 35 U.S.C. 154(b) by 490 days.

(21) Appl. No.: 11/063,949

(22) Filed: Feb. 23, 2005

(65) Prior Publication Data

US 2005/0229075 A1    Oct. 13, 2005

Related U.S. Application Data

(63) Continuation of application No. PCT/DE03/02111, filed on Jun. 25, 2003.

(30) Foreign Application Priority Data

Aug. 23, 2002   (DE)   ............................. 102 38 841

(51) Int. Cl.
   *H03M 13/00*   (2006.01)
(52) U.S. Cl. ...................................... 714/758; 714/795
(58) Field of Classification Search ................ 714/795, 714/792, 758
   See application file for complete search history.

(56) References Cited

U.S. PATENT DOCUMENTS

| 5,090,035 A | * | 2/1992 | Murase | 377/72 |
| 5,103,451 A | * | 4/1992 | Fossey | 714/757 |
| 5,390,189 A | * | 2/1995 | Tateishi | 714/728 |
| 5,748,652 A | * | 5/1998 | Kim | 714/807 |

(Continued)

FOREIGN PATENT DOCUMENTS

| EP | 0 052 357 B1 | 4/1987 |
| EP | 1 011 201 A2 | 6/2000 |
| EP | 1 211 813 A2 | 6/2002 |
| EP | 1211813 A2 * | 6/2002 |

OTHER PUBLICATIONS

"4-Bit Bidirectional Universal Shift Register", 54F/74F194, National Semiconductor, Nov. 1994, 7 pgs.

(Continued)

*Primary Examiner*—Mujtaba K Chaudry
(74) *Attorney, Agent, or Firm*—Eschweiler & Associates, LLC

(57) ABSTRACT

Depending on the sequence of the decoded payload signal bits ($a_{m1}, \ldots, a_{mA}$) and redundancy checking bits ($p_{m1}, \ldots, p_{mL}$) which are produced by the Viterbi traceback, either some of these bits are inserted by means of a distribution device (1) from the front into a linear feedback shift register (10), or some of these bits are inserted by means of the distribution device (1) from the rear into a linear feedback shift register (10), or all of them are inserted into a linear feedback shift register (20) from the rear with the allocated coefficients being unchanged, or all of them are inserted into a shift register from the front with the allocated coefficients being inverted. This allows a redundancy checking process to be carried out on a transmitted data block in the shift register (10; 20) without temporary storage of the bits produced by the decoding process.

4 Claims, 2 Drawing Sheets

U.S. PATENT DOCUMENTS

| | | | | |
|---|---|---|---|---|
| 5,920,593 | A | * | 7/1999 | Perl et al. .................... 375/222 |
| 6,041,433 | A | * | 3/2000 | Kamada ..................... 714/795 |
| 6,327,691 | B1 | * | 12/2001 | Huang ........................ 714/781 |
| 7,088,792 | B2 | * | 8/2006 | Rick .......................... 714/786 |

OTHER PUBLICATIONS

XP002255882 "Error Control Coding: Fundamentals and Applications", Shu Lin and D.J. Costello, 1987, Prentice Hall, Englewood Cliffs, pp. 98-103.

"A Reconfigurable Linear Feedback Shift Register (LFSR) for the Bluetooth System", P. Kitsos, N. Sklavos, N. Zervas and O. Koufopavlou, VLSI Design Laboratory, University of Patras, IEEE, vol. 2, Sep. 2, 2001, pp. 991-994.

3$^{rd}$ Generation Partnership Project (3GPP); Technical Specification Group Radio Access Network Multiplexing and Channel Coding (FDD) (3G TS 25.212 version 3.0.0), XP-002149187, Oct. 1999, 54 pgs.

International Search Report, Int'l Application No. PCT/DE03/02111, Int'l Filing Date Jun. 25, 2003, 3 pgs.

* cited by examiner

PARALLEL PROCESSING FOR DECODING AND CYCLIC REDUNDANCY CHECKING FOR THE RECEPTION OF MOBILE RADIO SIGNALS

REFERENCE TO RELATED APPLICATIONS

This application is a continuation of PCT/DE03/02111 filed on Jun. 25, 2003, which was not published in English, which claims the benefit of the priority date of German Patent Application No. DE 102 38 841.5, filed on Aug. 23, 2002, the contents of which both are herein incorporated by reference in their entireties.

FIELD OF THE INVENTION

The present invention relates to apparatus and methods for decoding and for cyclic redundancy checking of mobile radio signals.

BACKGROUND OF THE INVENTION

In the case of digital data transmissions, cyclic redundancy checks are frequently carried out in order to detect errors, which can occur during the data transmission process. In this case, data signals are transmitted in blocks, and a redundant code is produced from the data in each block and is added to the block for error detection or correction. In most cases, a so-called CRC code (cyclic redundancy check) is derived from the payload data in a block as a cyclic redundant code, using a predetermined algorithm. The CRC codes are produced by multiplication of a payload data signal sequence by a so-called generator polynomial. After reception of the code word, it is divided by the generator polynomial. If the received code word has been transmitted correctly, then the division process does not produce any remainder. Conversely, if the division process results in a remainder, then this confirms that the transmission was not correct.

Cyclic codes such as CRC codes are primarily of major interest for this application because the multiplication and division of polynomials can be carried out relatively easily by means of so-called linear feedback shift registers (LFSR). Multiplication by the generator polynomial thus makes it possible to generate code words, with the original information word being reproduced by the division of these code words, and the result being checked for errors at the same time. U.S. Pat. No. 5,748,652 describes, for example, a circuit for cyclic redundancy checking for detection and correction of errors in a data stream. In this case, in the receiver, the data stream is entered in a linear feedback shift register in which a division process is carried out by means of the generator polynomial. If a faulty code word is divided in this circuit, then the remainder produced after division by the generator polynomial remain in the memory cells in the shift register once the code word has been processed. Only if a correct code word has been entered is the value in all of the memory cells zero after the division process. This division remainder, which is also called the syndrome (polynomial), is then passed to an OR gate, whose output signal is passed to a decoder as an activation signal. The syndrome is passed to the decoder and, if the decoder is activated, is linked with the input data word in an EXCLUSIVE-OR circuit, thus producing a corrected data stream.

In order to improve the transmission reliability and eavesdropping protection, the data to be transmitted is subjected at the transmitter end to a channel coding method, in which the data to be transmitted has redundancy deliberately added to it. If so-called convolutional coding is used as the coding method, in which the redundancy is formed continuously by linking (convolution) of the information, then the efficient Viterbi algorithm is generally used in the decoder at the receiver end. It has been found that a low error rate can be achieved by first of all carrying out a CRC block coding process, after which a convolutional coding process is carried out on the block-coded data. In the case of a linked channel coding method such as this, a number of CRC bits are generally first of all added to the information to be transmitted, by means of a block code. The information that has been coded in this way is then coded by means of a convolutional coder. At the receiver end, the data sequence supplied to the convolutional coder at the transmitter end is then deduced recursively in a decoder by means of the Viterbi traceback algorithm.

The processing steps specified in the 3GPP-UMTS Standard TS 25.212 will be explained in more detail in the following text. At the transmitter end, a CRC code is added for each transport block in a set of transport blocks, which are each of the same size. For this purpose, the CRC code generator has four generator polynomials with polynomial degrees 8, 12, 16 and 24, which can be represented as follows:

$$g_{CRC8}(D)=1+D+D^3+D^4+D^7+D^8, \qquad (1)$$

$$g_{CRC12}(D)=1+D+D^2+D^3+D^{11}+D^{12}, \qquad (2)$$

$$g_{CRC16}(D)=1+D^5+D^{12}+D^{16}, \qquad (3)$$

$$g_{CRC24}(D)=1+D+D^5+D^6+D^{23}+D^{24}. \qquad (4)$$

The choice of one of these polynomials is defined by a decision made at a higher physical level at the transmitter end.

Starting from the m-th transport block (in a set of transport blocks) as a vector of bit length A $$a_m=(a_{m1}, a_{m2}, \ldots, a_{mA}), \qquad (5)$$

systematic CRC coding is carried out in accordance with the Standard mentioned above in such a way that the polynomial $$Z_m(D)=p_{mL}+p_{m(L-1)}D+\ldots+p_{m1}D^{L-1}+a_{mA}D^L+ \\ a_{m2}D^{A+L-2}+a_{m1}D^{A+L-1} \qquad (6)$$

has a remainder equal to zero when it is divided by the generator polynomial g(D). The bits in the payload signal vector $a_m$ and the bits which correspond to the remainder polynomial $$p_m(D)=p_{mL}+p_{m(L-1)}D+\ldots+p_{m1}D^{L-1} \qquad (7)$$

are mapped onto a vector $b_m$ as follows:

$$b_m=(b_{m1}, b_{m2}, \ldots, b_{m(A+L)})=(a_{m1}, \ldots, a_{mA}, p_{mL}, \ldots, p_{m1}) \qquad (8)$$

In this case, it can be stated that that bit which corresponds to the highest exponent in equation (6) appears in the least significant position in the vector $b_m$. The payload signal bits appear at the less significant positions in the vector $b_m$ and, in contrast, the CRC parity bits appear at the most significant positions. The CRC parity bits are, however, mapped onto the vector $b_m$ in their natural sequence, that is to say the coefficients which correspond to the low exponents in the remainder polynomial are mapped onto the less significant positions in $b_m$. In particular, that coefficient $p_{m1}$ which corresponds to the highest exponent in the remainder polynomial is matched onto the most significant bit position in $b_m$.

A total of M transport blocks such as these which have been provided with CRC parity bits are then linked to one another, and are passed to the channel coder.

The channel decoding process which is carried out at the receiver end can be carried out in various ways. In the case of the known "sliding window method", the data signals in a block are recovered in the sequence in which they were supplied to the convolutional coder at the transmitter end. In the case of the so-called exact Viterbi traceback operation and in which the Viterbi decoder stores the traceback data over the entire trellis, the data signals in a block are in contrast recovered in the opposite sequence to that in which they were supplied to the convolutional coder at the transmitter end, that is to say in the sequence indicated on the right-hand side of equation (8). The problem is now that the payload signal bits and parity bits which occur in this sequence cannot be passed directly to a conventional CRC error determination circuit, which is formed from a linear feedback shift register. For this reason, the so-called hard decision sequence (which occurs during the Viterbi traceback) of recovered signal data corresponding to the vector $b_m$ is first of all stored in a buffer store for one block or for the complete set of collated blocks. The data signals are then called up from the buffer store in the correct sequence, and are passed into the shift register in the CRC error determination circuit. The temporary storage of the values is on the one hand complex in terms of hardware since a corresponding amount of memory space must be made available and, on the other hand, it is associated with a time penalty, since the data must be stored in the memory and must be called up from it again.

The described requirement for temporary storage before carrying out the redundancy check on the basis of the bit sequence taken from the decoding process may, however, likewise occur when the abovementioned sliding window method is used for the Viterbi traceback. In this case as well, it is possible for the parity or redundancy checking bits to be added to the data block and to be obtained from the decoding process at the receiver end in such a way that the bit sequence does not allow the payload data bits and parity bits to be passed directly to the linear feedback shift register for polynomial division.

Furthermore, a situation can occur in which the bit sequence produced by the decoding process is the complete inverse of the sequence of bits in which they would be supplied to a conventional shift register for cyclic redundancy checking in order to carry out a correct polynomial division. In this case as well, the bits are therefore first of all temporarily stored in a complex manner in a buffer store.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later.

The present invention includes methods for cyclic redundancy checking of mobile radio signals, and corresponding apparatuses for carrying out the methods, which are matched to the sequence of payload data bits and parity bits produced by the decoding process, by means of which the implementation complexity and the latency time are reduced and which, in principle, allows parallel processing between decoding and cyclic redundancy checking. Additionally, the present invention is operable to pass the data signals determined during the decoding process directly and without temporary storage to a shift register for cyclic redundancy checking.

The methods according to the invention for cyclic redundancy checking of mobile radio signals as claimed in the independent patent claims are based on the situation, which is known per se, in which a payload signal bit sequence and a redundancy checking bit sequence such as a CRC bit sequence are each produced in blocks at the transmitter end, and are passed to a channel coder, with the bit sequences being decoded at the receiver end in a decoder which determines the sequence supplied to the channel coder and emits the determined values in such a way that the bit sequence is intrinsically not suitable for carrying out a cyclic redundancy check immediately, that is to say for directly entering the determined bits into a linear feedback shift register (LFSR) which is provided for this purpose.

Depending on the bit sequence produced by the decoding process, the present invention provides methods that allow the bit sequences of decoded payload signal bits and redundancy checking bits produced by the decoder to be passed to an LFSR without having to be previously temporarily stored in a buffer store.

The bit sequence which is supplied may, for example, be a sequence in which, although a first group of bits occurs in a suitable sequence, a second group of bits is, however, not positioned suitably relative to the first group and, furthermore, is in an unsuitable sequence, that is to say the inverse sequence. In consequence, a first method according to the invention provides for some of the bits to be passed to the shift register from a front end, and for some other bits to be passed to the shift register from a rear end.

The bit sequence which is produced may also be a sequence which is inverted overall in comparison to a bit sequence as would be required for direct inputting into a conventional LFSR in order to carry out a conventional polynomial division process. In this case, a second method according to the invention may be used, on the basis of which—as will be described in detail further below—the bits are either all inserted successively from the rear into an essentially conventional LFSR without changing the coefficients allocated to the multipliers, or the bits are all inserted into an LFSR successively from the front in the conventional manner, but with the coefficients allocated to the multipliers being inverted.

In both the stated cases, the bits can be passed to the LFSR by suitable apparatuses without using buffer stores. Once the last bit in the data block has been inserted into the LFSR, the polynomial division process is carried out in the LFSR, and hence the cyclic redundancy check.

An apparatus for performing redundancy checks in accordance with an aspect of the present invention comprises a distribution device, which has one input and two outputs, and a linear feedback shift register, with a first output of the distribution device being connected to a first input of the shift register, and a second output of the distribution device being connected to a second input of the shift register. The hard decision output values from the decoder are entered in the input of the distribution device. The distribution device is supplied with a control signal, by means of which the data signals are passed either to the first output or to the second output. The first input of the shift register is located on one side of the shift register chain and passes the data signals on this side to the shift register, while the second input of the shift register is located on the other side of the shift register chain, and passes data signals on this side to the shift register. Contact switches are located at both inputs of the shift register and can be opened or closed in order optionally to shift signal bits through the first input or through the second input into the shift register.

Another method in accordance with an aspect of the present invention is based on the bit sequence that is produced by the decoding process being inverted. In consequence, the method provides for the bit sequence to be passed to a linear feedback shift register for redundancy checking without the use of any distribution device as described above, but with the bits either being supplied to the shift register from its rear end without changing the sequence in which the coefficients are allocated to the multipliers, or for the bits to be passed to the shift register from its front end, but with the sequence in which the coefficients are allocated to the multipliers being inverted.

The above aspects of the invention mean that it is possible to pass the bits that are obtained from a Viterbi decoder or from some other trellis-based decoder to be passed directly to the CRC checking process. These bits can be inserted into the shift register in the CRC circuit immediately, and do not need to be temporarily stored in a buffer store that is provided specifically for this purpose in order then to be loaded from this buffer store into the shift register. There is therefore no need to provide the hardware for a buffer store, and it is possible to save the time required for storage of the bits and for calling them up from the memory.

The implementation of the present invention thus also means parallel processing of decoding and cyclic redundancy checking within a data block, or within a set of data blocks. Thus, for example, if a Viterbi decoder or some other trellis-based decoder uses a traceback operation to recursively determine the data sequence transmitted to the channel coder, it can also pass the determined bits on to the CRC checking circuit in order that they can be inserted into the shift register there. When the traceback operation in the Viterbi decoder has determined the last bit in a data block, and this has been passed on to the CRC decoder, then the bits which have already been determined prior to this will already have been shifted to the appropriate locations in the shift register, and the result of the CRC checking process can be emitted directly through the OR gate once the last bit has been inserted.

This type of parallel processing thus makes it possible to save further processing time at the receiving end.

BRIEF DESCRIPTION OF THE DRAWINGS

Aspects of the present invention will be explained in more detail in the following text with reference to two appropriate exemplary embodiments for corresponding apparatuses and in conjunction with the drawing figures, in which.

DETAILED DESCRIPTION OF THE INVENTION

Figure 1:
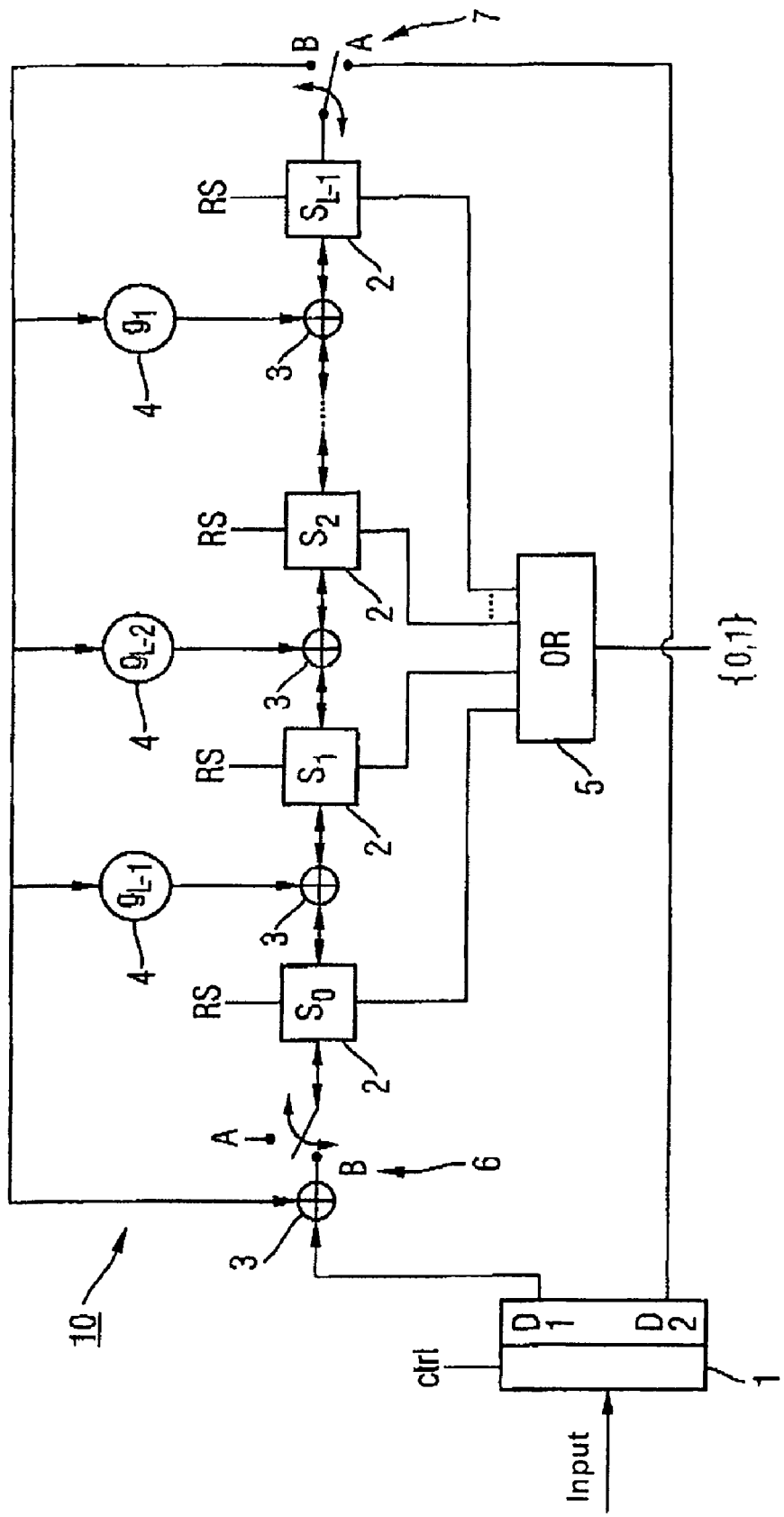
FIG. 1 shows an apparatus for carrying out a first method with a shift register and an upstream distribution device.

One or more implementations of the present invention will now be described with reference to the attached drawings, wherein like reference numerals are used to refer to like elements throughout, and wherein the illustrated structures are not necessarily drawn to scale.

As can be seen from FIG. 1, the decoded bits that are produced by a Viterbi decoder operating on the principle of exact Viterbi traceback, and are produced by the traceback operation for a transport block m, occur at the input of the CRC circuit. As can be seen from the equation (8):

$$b_m = (b_{m1}, b_{m2}, \ldots, b_{m(A+L)}) = (a_{m1}, \ldots, a_{mA}, p_{mL}, \ldots, p_{m1}) \quad (8)$$

the bits thus appear at the input as a consequence of having been determined, in the reverse time sequence, in the decoder in the sequence $p_{m1}, \ldots, p_{mL}, a_{mA}, \ldots, a_{m1}$.

The apparatus according to the invention first of all has a distribution device 1 which is used to distribute the bits between two different outputs D1 and D2. The distribution device 1 is supplied with a control signal CTRL in order to switch the signal output between D1 and D2.

The outputs D1 and D2 of the distribution device 1 are respectively connected to the front input and to the rear input of a linear feedback shift register (LFSR) 10. The LFSR 10 carries out a polynomial division process in a manner known per se, in order to check whether the data block has been transmitted correctly. The LFSR 10 has a number of memory cells 2, which store the value arising at the input, and pass on the previously stored value at the output, in each clock step. As is indicated by the dots, further memory cells 2 may be located between the memory cell 2 annotated $S_2$ and the memory cell 2 which is shown at the right-hand end of the shift register and is annotated $S_{L-1}$. Each memory cell 2 has its own reset input, by means of which, by way of example, all of the memory cells 2 can be set to zero at the start of a processing process. Exclusive-OR gates 3 are connected between the memory cells 2 and are used to add the value of the respective upstream memory cell 2 to the output value from the multipliers 4. The value which is applied to the input is multiplied in the multipliers 4 by a coefficient $g_n$ from the set $\{0,1\}$, and the product is emitted. The coefficients $g_n$ correspond to the coefficients in the generator polynomial selected at the transmitter end. The memory cells 2 are also connected to an OR gate 5. As was explained in the introduction with reference to After completion of the CRC checking operation, to determine whether the polynomial division has resulted in a remainder. If this is not the case and all of the memory cells 2 are thus at the value 0, then the OR gate 5 emits the value 0 at its output, so that it is possible to state that the transmission of the data block has been carried out correctly. If this is not the case, that is to say even if only one of the memory cells 2 is at the value 1, then the remainder of the polynomial division process is not equal to 0, and the OR gate 5 emits the value 1 at its output, thus confirming that the data has not been transmitted correctly. The CRC circuit also has contact switches 6 and 7, by means of which a contact between the respective outermost memory cell 2 in the LFSR 10 and the input or output of the LFSR 10 can be made or broken.

The CRC circuit operates as follows:

1. First of all, both contact switches 6 and 7 are placed in the switch position A, so that the LFSR 10 is set up to shift the bits from right to left.

2. For the first L clock cycles, the distribution device 1 activates the output D2 and deactivates the output D1, and is controlled appropriately by the control signal CTRL. The CRC parity bits $p_{m1}, \ldots, p_{mL}$ thus first of all enter the right-hand input of the LFSR 10 and are passed through the LFSR 10 from right to left.

3. The contact switches 6 and 7 are then placed in the contact position B, so that the LFSR 10 is now set up to shift the data bits from left to right.

4. The output D1 of the distribution device 1 is then activated, and the output D2 is deactivated, for the next A clock cycles. The information bits $a_{mA}, \ldots, a_{m1}$ are now shifted into the LFSR 10 from the left-hand side and are shifted from left to right in the LFSR 10, with the feedback line of the LFSR 10 being activated as a result of the contact switch 7 being in the switch position B. Once again, the switching of the distribution device 1 to the output D1 was initiated by an appropriate control signal ctrl.

5. Once the information bits have been inserted, the result of the CRC check on the checked data block is available at the output of the OR gate 5.
6. If the code block contains more than one transport block, the process starts at 1 again.

Figure 2:
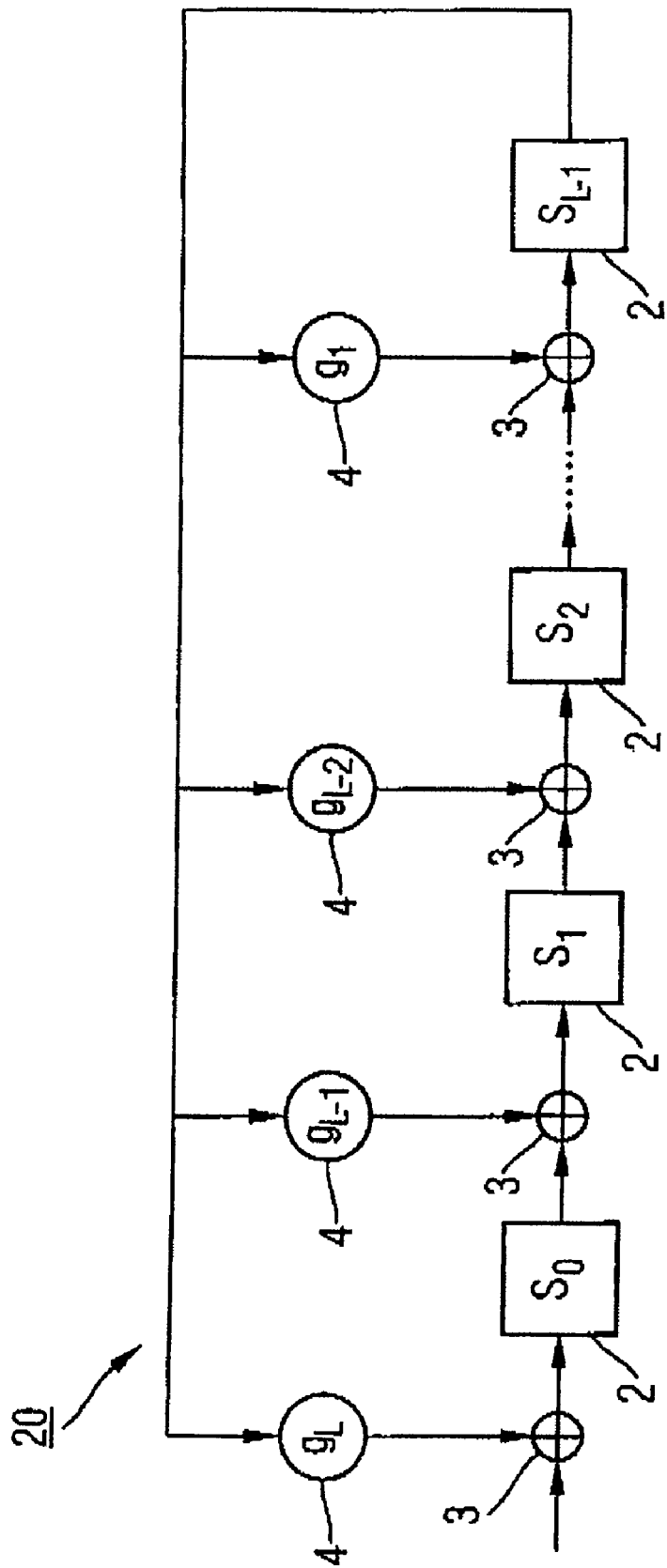
FIG. 2 shows an apparatus for carrying out a second method with a conventional shift register with the bits being supplied at the front end, and with the allocated coefficients being inverted.

FIG. 2 shows an exemplary embodiment of an apparatus for carrying out the second method according to the invention. This method is used when the bit sequence of the supplied bits is completely inverted with respect to a bit sequence as would be required for the use of a conventional LFSR.

This apparatus has a linear feedback shift register 20. Exclusive-OR gates 3 are connected between the series-connected memory cells 2 annotated $S_0$ to $S_{L-1}$, and their two inputs are respectively connected to the outputs of multipliers 4 and to the outputs of the respective upstream memory cells 2. A feedback line which is connected to the last memory cell $S_{L-1}$ is connected to all of the multipliers 4. The first multiplier 4 is connected to a first exclusive-OR gate 3, which is connected upstream of the first memory cell 2 and whose second input is supplied with the bit sequence produced by the decoding process. The illustrated exemplary embodiment is based on the assumption that the decoding process produces a bit sequence $p_{mL}, \ldots, p_{m1}, a_{mA}, \ldots, a_{m1}$ composed of A payload signal bits and L redundancy checking bits. The coefficients are allocated in such a way that the multiplier 4 to which the coefficient $g_L$ is applied is connected to the first input-side exclusive-OR gate 3, and the multiplier 4 to which the coefficient $g_1$ is applied is connected to the last output-side exclusive-OR gate 3, and the coefficients in the intermediate processing stages are supplied to the multipliers 4 in the natural sequence of the indices. If this coefficient allocation has not already been preset, it can be changed in the described manner by means of a device which is not illustrated but is connected to the shift register 20.

An alternative apparatus, which is fundamentally equivalent to the apparatus shown in FIG. 2, for carrying out the second method on the assumption of a bit sequence produced by the decoding process with a sequence $p_{mL}, \ldots, p_{m1}, a_{mA}, \ldots, a_{m1}$ composed of A payload signal bits and L redundancy checking bits has mirror-image symmetry with the apparatus shown in FIG. 2, with the bits being entered in an exclusive-OR gate from the right, and with this exclusive-OR gate being connected to the memory cell annotated $S_{L-1}$. The bits are shifted through the shift register from right to left. On the left-hand side, the feedback line is connected to the output of the memory cell which is annotated $S_0$.

The method according to the invention can be used particularly advantageously in conjunction with a specific 3GPP Standard mode, known as blind transport format detection (BTFD). This mode is based on both the size A of a transport block and the total number M of transport blocks being dynamic variables which can vary between the transmission time intervals (TTI). These parameters are normally known to the receiver since the current transport format as selected by the transmitter is transmitted on a control channel. However, it is also possible for the receiver to be requested to detect the current transport format blindly, and this is done by carrying out the channel decoding and CRC decoding processes for a selected set of all possible transport formats in the transport format set. One example of an algorithm for the BTFD mode is described in Annex A of the 3GPP TS 25.212 Standard "Channel Coding and Multiplexing", the content of which is herein incorporated by reference. Since a number of traceback operations thus have to be carried out in the Viterbi decoder in this mode, and each have to be followed by CRC checks, it is in fact a major advantage for this mode if the total process duration for channel decoding and CRC decoding can be reduced.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. An apparatus for cyclic redundancy checking comprising:
    a Viterbi decoder configured to decode a data block comprising payload signal bits and redundancy checking bits from a received signal and to reverse a sequence of the payload signal bits;
    a distribution device comprising an input and first and second outputs;
    a shift register with linear feedback having first and second inputs, wherein the linear feedback is provided with the first input, wherein the first input is connected to the first output of the distribution device and the second input is connected to the second output of the distribution device; and
    wherein the distribution device receives the data block and directs the payload signal bits to the first input of the shift register and directs the redundancy checking bits to the second input of the shift register.

2. The apparatus of claim 1, further comprising a first contact switch between the first output of the distribution device and the first input of the shift register and a second contact switch between the second output of the distribution device, the second input of the shift register, and a feedback path of the shift register.

3. The apparatus of claim 2, wherein the second contact switch comprises a first switch position and a second switch position;
    in the first switch position, the second contact switch connects the second output of the distribution device with the second input of the shift register; and
    in the second switch position, the second contact switch connects the second input of the shift register with an XOR component arranged between the first output of the distribution device and the first contact switch.

4. The apparatus of claim 1, wherein the shift register comprises a plurality of memory cells connected in series and an OR gate connected to the plurality of memory cells that identifies errors.

* * * * *